United States Patent [19]

Bills et al.

[11] Patent Number: 5,278,023
[45] Date of Patent: Jan. 11, 1994

[54] PROPELLANT-CONTAINING THERMAL TRANSFER DONOR ELEMENTS

[75] Inventors: Richard E. Bills, Woodbury; William V. Dower, St. Paul; Thomas A. Isberg, Apple Valley; Stanley C. Busman, Minneapolis; Jeffrey C. Chang, North Oaks; Minyu Li, Oakdale; Hsin-hsin Chou, Woodbury, all of Minn.

[73] Assignee: Minnesota Mining and Manufacturing Company, Saint Paul, Minn.

[21] Appl. No.: 977,215

[22] Filed: Nov. 16, 1992

[51] Int. Cl.$^5$ .................... G03C 5/54; G03C 5/16
[52] U.S. Cl. .................. 430/201; 430/152; 430/162; 430/175; 430/195; 430/166; 430/204; 430/270; 430/271; 430/964; 430/944
[58] Field of Search ............... 430/201, 152, 964, 204, 430/175, 195, 162, 166, 270, 271, 944

[56] References Cited

U.S. PATENT DOCUMENTS

| | | | |
|---|---|---|---|
| T880,011 | 11/1970 | Jaskowsky | 430/201 |
| 3,314,073 | 4/1967 | Becker | 346/76 |
| 3,429,900 | 2/1969 | Spatz et al. | 260/391 |
| 3,645,917 | 2/1972 | Vandenberg | 260/2 A |
| 3,650,796 | 3/1972 | Jackson et al. | 117/8 |
| 3,655,379 | 4/1972 | Gundlach | 96/27 |
| 3,694,383 | 9/1972 | Azami et al. | 260/2 X |
| 3,745,235 | 7/1973 | Bestenreiner et al. | 178/5.2 R |
| 3,745,586 | 7/1973 | Braudy | 346/76 |
| 3,747,117 | 7/1973 | Fechter | 346/1 |
| 3,751,587 | 8/1973 | Insler et al. | 178/6.6 R |
| 3,780,214 | 12/1973 | Bestenreiner et al. | 178/5.2 R |
| 3,787,210 | 12/1973 | Bestenreiner et al. | 178/5.2 R |
| 3,945,318 | 3/1976 | Landeman | 101/467 |
| 3,961,513 | 6/1976 | Eames | 428/323 |
| 3,964,389 | 6/1976 | Peterson | 101/467 |
| 3,978,247 | 8/1976 | Braudy et al. | 427/43 |
| 4,023,185 | 5/1977 | Bloom et al. | 346/135 |
| 4,032,691 | 6/1977 | Kido et al. | 428/304 |
| 4,245,003 | 1/1981 | Oransky et al. | 428/323 |
| 4,268,450 | 5/1981 | Frankel et al. | 260/349 |
| 4,393,199 | 7/1983 | Manser | 528/408 |
| 4,414,384 | 11/1983 | Berkowitz et al. | 528/417 |
| 4,426,437 | 1/1984 | Fisch et al. | 430/166 |
| 4,483,978 | 11/1984 | Manser | 428/408 |

(List continued on next page.)

FOREIGN PATENT DOCUMENTS

| | | |
|---|---|---|
| 63-60793 | 3/1988 | Japan. |
| 63-161445 | 7/1988 | Japan. |
| 64-14081 | 1/1989 | Japan. |
| 88/03667 | 5/1988 | PCT Int'l Appl. |
| 90/12342 | 10/1990 | PCT Int'l Appl. |
| 91/06813 | 5/1991 | PCT Int'l Appl. |
| 92/06410 | 4/1992 | PCT Int'l Appl. |
| 2176018 | 5/1985 | United Kingdom. |

Primary Examiner—Richard L. Schilling
Attorney, Agent, or Firm—Gary L. Griswold; Walter N. Kirn; Gregory A. Evearitt

[57] ABSTRACT

Laser-addressable thermal transfer materials for producing color proofs, printing plates, films, printed circuit boards, and other media are disclosed. The materials contain a substrate coated thereon with a propellant layer wherein the propellant layer contains a material capable of producing nitrogen ($N_2$) gas at a temperature of preferably less than about 300° C.; a radiation absorber; and a thermal mass transfer material. The thermal mass transfer material may be incorporated into the propellant layer or in an additional layer coated onto the propellant layer. The radiation absorber may be employed in one of the above-disclosed layers or in a separate layer in order to achieve localized heating with an electromagnetic energy source, such as a laser. Upon laser induced heating, the transfer material is propelled to the receptor by the rapid expansion of gas. The thermal mass transfer material may contain, for example, pigments, toner particles, resins, metal particles, monomers, polymers, dyes, or combinations thereof.

Also disclosed is a process for forming an image as well as an imaged article made thereby.

39 Claims, No Drawings

U.S. PATENT DOCUMENTS

| | | | |
|---|---|---|---|
| 4,525,722 | 6/1985 | Sachdev et al. | 346/1.1 |
| 4,547,444 | 10/1985 | Bell et al. | 430/11 |
| 4,549,824 | 10/1985 | Sachdev et al. | 400/241.1 |
| 4,552,826 | 11/1985 | Fisch | 430/142 |
| 4,582,776 | 4/1986 | Matsui et al. | 430/270 |
| 4,588,674 | 5/1986 | Stewart et al. | 430/273 |
| 4,599,298 | 7/1986 | Fisch | 430/271 |
| 4,626,493 | 12/1986 | Butters et al. | 430/201 |
| 4,657,840 | 4/1987 | Fisch | 430/201 |
| 4,702,958 | 10/1987 | Itoh et al. | 428/323 |
| 4,705,739 | 11/1987 | Fisch | 430/276 |
| 4,711,834 | 12/1987 | Butters et al. | 430/201 |
| 4,879,419 | 11/1989 | Johannessen | 568/606 |
| 4,897,336 | 1/1990 | Chien | 430/197 |
| 4,961,313 | 10/1990 | Dolan | 60/223 |
| 4,962,213 | 10/1990 | Frankel et al. | 552/12 |
| 5,017,547 | 5/1991 | DeBoer | 503/227 |
| 5,089,372 | 2/1992 | Kirihata et al. | 430/167 |
| 5,109,549 | 5/1991 | Kellogg et al. | 503/227 |
| 5,156,938 | 10/1992 | Foley et al. | 430/200 |
| 5,171,650 | 12/1992 | Ellis et al. | 430/201 |

PROPELLANT-CONTAINING THERMAL TRANSFER DONOR ELEMENTS

FIELD OF THE INVENTION

This invention relates to thermally imageable materials for the production of color proofs, printing plates, films, printed circuit boards, and other graphic arts media using thermal transfer imaging methods. More particularly, this invention relates to propellant-containing thermal transfer donor elements.

BACKGROUND OF THE INVENTION

Laser induced thermal transfer of materials from a donor sheet to a receptor layer has been described in the patent and technical literature for nearly thirty years. However, few commercial systems have utilized this technology. Exposure fluences required to transfer materials to a receptor have been, at best, on the order of 0.1 Joule/cm$^2$ (i.e., J/cm$^2$). Consequently, lasers capable of emitting more than 5 Watts of power, typically water-cooled Nd:YAG lasers, have been required to produce large format images (A3 or larger) in reasonable times. These lasers are expensive and impractical for many applications. More recently, single-mode laser diodes and diode-pumped lasers producing 0.1–4 Watts in the near infrared region of the electromagnetic spectrum have become commercially available. Diode-pumped Nd:YAG lasers are good examples of this type of source. They are compact, efficient, and relatively inexpensive. In order to use these new sources in a single-beam, large format imaging system, the exposure fluence of thermal transfer materials should be reduced to less than 0.04 J/cm$^2$ and the exposure pixel dwell time should be less than 300 nanoseconds. There have been many unsuccessful efforts in the art to achieve this goal.

Separately addressed laser diode arrays have been utilized to transfer dyes in color proofing systems. For example, U.S. Pat. No. 5,017,547 describes the binderless transfer of dye from a dye-binder donor sheet to a polymeric receptor sheet. In that process, dye molecules are vaporized or sublimed via laser heating. These molecules traverse the gap between the donor and receptor and recondense on the receiver. The donor and receptor are separated by spacer beads. This technique has several disadvantages. First, the state change of dye (i.e., solid to vapor) requires high energy fluences ($\sim 0.5$ J/cm$^2$) and relatively long pixel dwell times ($\sim 10$ $\mu$sec), thus requiring multiple beam arrays for rapid imaging of large format areas. A plastic-coated receptor is required for proper laser addressed transfer. The image on this receptor must then be retransferred to plain paper, a step that adds cost, complexity, and time to the printing process.

U.S. Pat. No. 3,978,247 discloses the use of binderless, abrasion-resistant dyes coated on transparent donors. The dyes employed have low vaporization temperatures and low heats of vaporization. The binderless coating contains less thermal mass and therefore, the exposure energy required to transfer the dye should be less than that required in the system of U.S. Pat. No. 5,017,547. However, no examples demonstrating less exposure energy were disclosed in U.S. Pat. No. 3,978,247. In general, however, dyes are inadequate for critical proofing applications where the proof is used as a diagnostic tool to evaluate press performance. Printing presses print with pigments; therefore, the proof should be printed with pigments to properly match the characteristics of the printing press. Laser addressed proofing with pigments is difficult because pigments typically have a high vaporization temperature and are intrinsically less volatile than dye molecules, making direct thermal transfer of pigments difficult.

Exothermic heat-producing reactions have been used for the thermal transfer of inks. For example, in U.S. Pat. No. 4,549,824 aromatic azido compounds were incorporated into thermal transfer inks. When heated to 170° C., the aromatic azido compound melts the ink and allows it to flow into a receptor, such as plain paper. The heat generated by the decomposition of the aromatic azido compound reduces the amount of heat that must be supplied by the thermal head or laser source, thereby improving the overall imaging throughput. However, the process occurs over a relatively long time scale ($\geq 1$ msec), thereby resulting in significant heat diffusion and heat loss. In addition, pressure between the donor and receptor is required to maintain uniform transfer. An optically transparent means of applying pressure (e.g., a cylindrical lens or a flat glass plate) is difficult to employ in high resolution laser-based imaging systems.

Laser induced propulsive transfer processes can be used to achieve exposure fluences and pixel dwell times that are substantially less than those of the previously disclosed processes. U.S. Pat. No. 3,787,210 discloses the use of laser induced propulsive transfer to create a positive and negative image on film. A clear substrate was coated with heat-absorbing particles dispersed in a self-oxidizing binder. In that patent, the heat absorber was carbon black and the binder was nitrocellulose. The donor sheet was held in intimate contact with a receptor. When the coating was locally heated with a laser, combustion in the binder was initiated, thus blowing the carbon black onto the receptor. The receptor could be paper, adhesive film, or other media. The self-oxidizing binder was employed to reduce the exposure fluence required to achieve imaging.

In U.S. Pat. No. 3,964,389, crosslinkable resins were added to a carbon black/nitrocellulose coating and the material was transferred to aluminum by imagewise heating with a laser. The resin was thermally crosslinked on the aluminum to produce a lithographic printing plate.

U.S. Pat. No. 3,962,513 discloses the use of a dual-layer coating construction for the production of lithographic printing plates. The first layer was a coating of carbon black and nitrocellulose binder coated on top of a clear substrate. An overlying layer of crosslinkable, ink-receptive resin was coated over this propellant layer. Upon laser heating, the resin was transferred to an aluminum plate. The run length and the image sharpness of the resulting plate were improved with this construction. That patent discusses the advantages of placing the propellant in a separate layer below the material to be transferred. Unlike the single layer case, the expansion of gas serves to propel the transfer material from behind, thus achieving forward propulsion of the transfer material toward the paper and minimal lateral dispersion. Exposure fluence measurements were not disclosed, but examples presented later herein show that more energy is required to expose media that use commercially available nitrocellulose in the underlying propellant layer than materials used in the present invention.

Nitrocellulose propellant layers have several undesirable characteristics when employed in imaging systems, as pointed out in British Patent Application No. 2,176,018. For example, mixed oxides of nitrogen are produced during decomposition of nitrocellulose, forming a corrosive acid that can damage the imaging apparatus. Nitrocellulose with high nitration levels is required to produce sufficient amounts of gas during imaging. However, this form of nitrocellulose presents safety and storage risks (explosion hazard). In addition, exact and uniform reproduction of nitrocellulose is difficult to achieve as explained in PCT Application No. 87/02904. As a consequence, an alternative to nitrocellulose as a blowing agent is needed.

U.S. Pat. No. 4,245,003 discloses the use of graphite in an ethyl cellulose binder for producing films. By using graphite, the imaged areas of the negative transparency were blown clean. In that case, the binder was not self-oxidizing. No exposure fluence information was disclosed. Graphite images are not useful in color proofing applications.

The use of decomposable polymers for color proofing applications is disclosed in PCT Application No. 90/01635. A single layer containing pigment, infrared dye, acid initiator, and polymeric binder was coated on a transparent substrate. Upon heating with a Nd:YAG laser, an acid was produced that rapidly decomposed the polymer to produce gas. An exposure energy of 0.1 J/cm² was required to transfer this material. The gas serves to propel the pigment to a receiver such as plain paper, but that construction does not provide the flexibility to transfer many types of materials due to the compatibility of the components in the single layer construction. For this reason, the use of a two layer construction that does not require excessive exposure energy would be preferred.

PCT Application No. 91/06813 discloses methods and materials for thermal imaging using an "ablation-transfer" technique. The donor element for that imaging process comprises a support, an intermediate dynamic release layer, and an ablative carrier topcoat. The topcoat carries the colorant. The dynamic release layer may also contain infrared-absorbing (light to heat conversion) dyes or pigments. No specific examples of azido group-containing polymers were given. Nitrocellulose as a binder was disclosed.

Copending U.S. application Ser. No. 07/855,799 discloses ablative imaging elements comprising a substrate coated on a portion thereof with an energy sensitive layer comprising a glycidyl azide polymer in combination with a radiation absorber. Demonstrated imaging sources were infrared, visible, and ultraviolet lasers. Solid state lasers were disclosed as exposure sources although laser diodes were not specifically mentioned. That application concerns formation of relief printing plates and lithographic plates by ablation of the energy sensitive layer. No mention of utility for thermal mass transfer was made.

U.S. Pat. No. 5,089,372 discloses transfer recording media comprising a substrate having sequentially coated thereon a layer of a photolyzable compound (e.g., aromatic diazo and azide compounds) and a solid ink layer.

Japanese Kokai Patent Appln. No. 64-14081 discloses a thermal transfer recording medium comprises of an interlayer containing a photolyzable compound; light-to-heat conversion layer; and thermally transferable ink layer deposited on one side of a transparent support. Aromatic azide compounds are preferred for use as the photolyzable compound.

In view of the foregoing, what is needed in the industry are thermal transfer donor elements which overcome the above-disclosed deficiencies of conventional systems.

SUMMARY OF THE INVENTION

In accordance with the present invention, it has now been discovered that a gas-producing polymer with a thermally available nitrogen content of greater than about 10 weight percent (as defined later herein) serve as excellent propellants for thermal mass transfer materials.

Thus, in one embodiment, the present invention provides thermal transfer donor elements comprising a substrate having coated on at least a portion thereof a layer comprising: (a) a gas-producing polymer having a thermally available nitrogen content of greater than about 10 weight percent; (b) a radiation absorber; and (c) a thermal mass transfer material.

In another embodiment, the present invention provides thermal transfer donor elements comprising a substrate having coated on at least a portion thereof a first layer comprising: (a) a gas-producing polymer having a thermally available nitrogen content of greater than about 10 weight percent, and (b) a radiation absorber; and a second layer comprising a thermal mass transfer material coated onto the first layer.

In another embodiment, the present invention provides thermal transfer donor elements comprising a substrate having coated successively thereon: (a) a first layer comprising a radiation absorber; (b) a second layer comprising a gas-producing polymer having a thermally available nitrogen content of greater than about 10 weight percent; and (c) a third layer comprising a thermal mass transfer material.

In still another embodiment, the present invention provides thermal transfer donor elements comprising a substrate having successively coated thereon: (a) a first layer comprising a gas-producing polymer having a thermally available nitrogen content of greater than about 10 weight percent; (b) a second layer comprising a radiation absorber; and (c) a third layer comprising a thermal mass transfer material.

Preferably, the gas-producing polymer has a thermally available nitrogen content of greater than about 20 weight percent and more preferably, greater than about 30 weight percent.

In one preferred embodiment, the gas-producing polymer has the following formula:

$$(X + R)_n)_m L \qquad (I)$$

wherein:
X represents a hydroxyl, mercapto, or amino group;
R represents a divalent monomer group, containing a thermally decomposable nitrogen-containing group, derived from an oxirane, a thiirane, or aziridine group;
L represents a mono-, di-, tri- or tetra-valent alkyl radical and correspondingly, m represents 1, 2, 3, or 4; and
n represents any integer greater than 1.

It is preferred that the foregoing gas producing polymer of Formula I is reacted with a suitable crosslinking agent.

In another preferred embodiment, the gas-producing polymer is a poly[bis(azidomethyl)oxetane] having recurring units of the following formula:

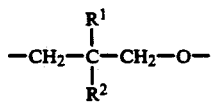 (II)

wherein $R^1$ and $R^2$ each independently represent a thermally decomposable nitrogen-containing group; e.g., azido, nitroto, nitro, triazole, etc.

In another preferred embodiment, the gas-producing polymer is an energetic copolymer having repeating units derived from different monomers, one or both of which have pendant energetic nitrogen-containing groups such as azido, nitro, nitrato, etc. Preferably the monomers are cylcic oxides having three to six atoms in the ring. The energetic polymers are preferably azido, nitro, or nitrato derivatives of oxetane or tetrahydrofuran. Copolymerization is preferably carried out by cationic polymerization according to the disclosure of U.S. Pat. No. 4,483,978 incorporated by reference herein.

As used herein:
  "thermally available nitrogen content" refers to the nitrogen content (weight percentage basis) of a material which upon exposure to heat (preferably less than about 300° C. and more preferably less than about 250° C.) generates or liberates nitrogen ($N_2$) gas;
  "thermally decomposable nitrogen-containing group" refers to a nitrogen-containing group (e.g., azido, nitrate, nitro, triazole, etc.) which upon exposure to heat (preferably less than about 300° C., more preferably less than about 250° C.) generates or liberates $N_2$ gas.
  "thermal mass transfer material" refers to a material such as, for example, a colorant, pigment, or a crystalline dye (with or without binder) which is transferred in thermal imaging processes from a donor element to the surface of a receptor element by action of a thermal source, but without sublimation of the material;
  "group" refers to not only pure hydrocarbon chains or structures such as methyl, ethyl, cyclohexyl, and the like, but also to chains or structures bearing conventional substituents in the art such as hydroxy, alkoxy, phenyl, halo (F, Cl, Br, I), cyano, nitro, amino, etc.; and
  "radical" refers to the inclusion of only pure hydrocarbon chains such as methyl, ethyl, propyl, cyclohexyl, isooctyl, tert-butyl, and the like.

The inventive thermal transfer donor elements utilize propellant materials which produce a high propulsive force, thereby decreasing the exposure fluence required to induce transfer of imaging material to a receptor layer material. For example, exposure fluences of 0.03 J/cm$^2$ and pixel dwell times of 300 nanoseconds have been achieved utilizing the propellant materials disclosed herein, thus enabling the use of simple, single-beam scanners based on diode-pumped lasers such as diode-pumped Nd:YAG lasers. The propellant materials utilized herein can be stored easily and exhibit good shelf life stability as compared to nitrocellulose and other propellants. Additionally, no corrosive gases are produced by the propellant. The thermal transfer donor elements of the present invention can be used to transfer colorants directly to a wide variety of substrates including plain paper.

Other aspects, benefits, and advantages of the present invention are apparent from the detailed description, the examples, and the claims.

DETAILED DESCRIPTION OF THE INVENTION

Thermal transfer donor elements of the present invention comprise a substrate coated on at least a portion thereof with a propellant layer comprising a gas-producing polymer having a thermally available nitrogen content greater than about 10 weight percent, preferably greater than about 20 weight percent, and more preferably greater than about 30 weight percent; a radiation absorber; and a thermal transfer material. Preferably, the nitrogen content of the reaction product is thermally decomposable at a temperature below about 300° C., and most preferably, below about 250° C. The radiation absorber and transfer material may be included in either the propellant layer or in a separate layer coated adjacent to, e.g., onto the propellant layer.

The gas-producing polymer may be any polymer that liberates nitrogen gas ($N_2$) when heated rapidly, such as, for example, by exposure to an infrared laser beam. Polymers that liberate nitrogen gas on heating generally have thermally decomposable functional groups. Non-limiting examples of suitable thermally decomposable functional groups include azido, alkylazo, diazo, diazonium, diazirino, nitro, nitrato, triazole, etc. The thermally decomposable groups may be incorporated into the gas-producing polymer either prior to polymerization or by modification of an existing polymer, such as, for example, by diazotization of an aromatic ring (e.g., with sodium nitrite) or diazo transfer with tosyl azide onto an amine or β-diketone in the presence of triethylamine.

In one preferred embodiment, the gas-producing polymer has the following formula:

 (I)

wherein:
  X represents a hydroxyl, mercapto, or amino (including mono-alkyl and aryl substituted amino) group. Preferably X is a hydroxyl group.
  R represents a divalent monomer group, containing a thermally decomposable nitrogen-containing group, derived from an oxirane such as, for example, $CH_2CH(CH_2N_3)O$—, —$CH(CH_2N_3)CH_2O$—, —$CH_2C(CH_2N_3)_2CH_2O$—,
  —$CH(CH_2N_3)CH(CH_2N_3)O$—, and —$CH_2CH(N_3)CH_2O$—; a thiirane such as, for example, —$CH_2CH(CH_2N_3)S$—, —$CH(CH_2N_3)CH_2S$—, —$CH_2C(CH_2N_3)_2CH_2S$—, —$CH(CH_2N_3)CH(CH_2N_3)S$—, and —$CH_2CH(N_3)CH_2S$—; and an aziridine such as, for example, —$CH_2CH(CH_2)N(CH_3)$—, —$CH_2CH(CH_2N_3)CH_3$—, —$CH(CH_2N_3)CH_2NH$—, —$CH_2C(CH_2N_3)_2CH_2NH$—, —$CH(CH_2N_3)CH(CH_2N_3)N(CH_3)$—, and —$CH_2CH(N_3)CH_2N(CH_3)$—.
  L represents a mono-, di-, tri- or tetra-valent alkyl radical. Non-limiting examples of monovalent radicals are methyl and ethyl. Non-limiting examples of polyvalent alkyl radicals are ethylene, methylene, propylene, 1,2,3-propanetriyl, 2,2-dimethylene-1,3-propanediyl, etc. Preferably, L is 1,2,3-propanetriyl.

Corresponding to L, m represents 1, 2, 3, or 4.

n represents any positive integer greater than 1, preferably greater than 5, more preferably greater than 10.

The foregoing gas-producing polymer of Formula (I) can be made by procedures well known to those skilled in the art of synthetic organic chemistry such as disclosed, for example, in U.S. Pat. Nos. 3,645,917 and 4,879,419, the disclosures of which are incorporated herein by reference.

One or more crosslinking agents may be employed in combination with the gas-producing polymer of Formula I to provide coatings having improved strength. The choice of an appropriate crosslinking agent depends on the functional groups pendant on the gas-producing polymer. Thus, if hydroxyl groups are present on the gas-producing polymer, then crosslinking agents for polyols could be employed (e.g., isocyanates). In cases where free-radically polymerizable pendant groups, such as acrylates, are attached to the polymer backbone, a free-radical initiator may be used as a crosslinking agent.

Preferably, a crosslinking agent for polyols is employed in combination with a gas-producing polymer having multiple hydroxyl end groups. Preferred crosslinking agents in this case are polyisocyanates, including but not limited to, hexamethylene diisocyanate; diphenylmethane diisocyanate; bis(4-isocyanatocyclohexyl)methane, 2,4-tolylene diisocyanate, etc.

In another preferred embodiment, the gas-producing polymer is a poly[bis(azidomethyl)oxetane] having recurring units of the following formula:

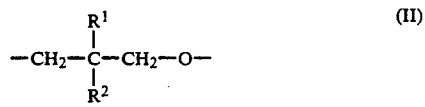

(II)

wherein $R^1$ and $R^2$ each independently represent a thermally decomposable nitrogen-containing group, e.g., azido, nitro, nitrato, triazole, etc. An example of a preferred azido group is $-CH_2N_3$.

The formula gas-producing polymer of Formula (II) can be made by procedures well known to those skilled in the art of synthetic organic chemistry such as disclosed, for example, in U.S. Pat. No. 3,694,383, the disclosure of which is incorporated herein by reference.

In another preferred embodiment, energetic copolymers having repeating units derived from different monomers, one or both of which have pendant energetic nitrogen-containing groups such as azido, nitro, or nitrato derivatives. Preferably the monomers are cyclic oxides having three to six ring atoms. The energetic monomers are preferably azido, nitro, triazole, or nitrato derivatives of oxirane, oxetane or tetrahydrofuran. Copolymerization of the monomers is preferably carried out by cationic polymerization. The foregoing energetic copolymers and their method of preparation are disclosed in U.S. Pat. No. 4,483,978, the disclosure of which is incorporated herein by reference.

Thermal mass transfer materials suitable for use in the present invention include dyes such as those listed in Venkataraman, *The Chemistry of Synthetic Dyes*; Academic Press, 1970: Vols. 1–4 and *The Colour Index Society of Dyers and Colourists*, Yorkshire, England, Vols. 1–8 including cyanine dyes (including streptocyanine, merocyanine, and carbocyanine dyes), squarylium dyes, oxonol dyes, anthraquinone dyes, and holopolar dyes, polycyclic aromatic hydrocarbons, etc.; metal oxides and mixed oxides such as titanium dioxide, silica, alumina, oxides of chromium, iron, cobalt, manganese, nickel, copper, zinc, indium, tin, antimony and lead, black aluminum; metal films derived from virtually any atmospherically stable metal including, but not limited to, aluminum, scandium, titanium, vanadium, chromium, manganese, iron, cobalt, nickel, copper, zinc, gallium, germanium, yttrium, zirconium, niobium, molybdenum, ruthenium, rhodium, palladium, silver, cadmium, indium, tin, antimony, lanthanum, gadolinium, hafnium, tantalum, tungsten, rhenium, osmium, iridium, platinum, gold, thallium, and lead; colored and/or fluorescent pigments known for use in the imaging arts including those listed in the *Pigment Handbook*; Lewis, P. A., Ed.: Wiley; New York, 1988, or available from commercial sources such as Hilton-Davis, Sun Chemical Co., Aldrich Chemical Co., Imperial Chemical Industries, etc.; semiconductors such as carbon (including diamond graphite), silicon, arsenic, gallium arsenide, gallium antimonide, gallium phosphide, aluminum antimonide, indium antimonide, indium tin oxide, zinc antimonide, etc.; electrographic or electrophotographic toners; phosphors, such as those used for television or medical imaging purposes; electroless plating catalysts; polymerization catalysts; curing agents; and photoinitiators.

Also, it is often desirable to thermal mass transfer materials to a substrate to provide a modified surface (for example, to increase or decrease adhesion or wetability) in an image-wise fashion. For those applications, the transfer materials may be polymers or copolymers such as silicone polymers as described by M. W. Ranney in *Silicones*: Noyes Data Corp., 1977, Vols. 1 and 2; fluorinated polymers, polyurethanes, acrylic polymers, epoxy polymers, polyolefins, styrene-butadiene copolymers, styrene-acrylonitrile copolymers, polyethers, and phenolic resins such as novolak resins, and resole resins.

In other cases it is desirable to transfer curable materials such as monomers or uncured oligomers or crosslinkable resins. In those cases the thermal mass transfer material may be a polymerizable monomer or oligomer. The properties of the material should be selected so that volatility of the monomer or oligomer is minimal to avoid storage problems. Suitable polymerizable materials include acrylate-terminated polysiloxanes, polyurethanes, polyethers, etc.

When the thermal mass transfer material is coated as a separate layer on the propellant it may be coated by a variety of techniques known in the art including, but not limited to, coating from a solution or dispersion in an organic or aqueous solvent (e.g., bar coating, knife coating, slot coating, slide coating, etc.), vapor coating, sputtering, grayure coating, etc., as dictated by the requirements of the thermal mass transfer material itself.

To improve speed of the thermal mass transfer materials utilized in the present invention, one or more accelerators for azide decomposition may be added to the propellant layer or a layer adjacent thereto. Useful accelerators for azide decomposition include those materials known in the art to reduce the decomposition temperature of alkyl azide compounds including, but not limited to, metal complexes such as ferrous acetylacetonate, stannous chloride, magnesium chloride, ferric chloride, zinc bromide, etc.; protic acids such as benzoic acid, acetic acid, p-toluenesulfonic acid, etc.; thermally sensitive free-radical initiators such as benzoyl peroxide, t-butyl perbenzoate, etc.; phosphines such as triphenylphosphine; and the like.

Sensitivity of the thermal mass transfer donor elements of the present invention may also be increased by incorporation of a surfactant (as described by M. R. Porter in *Handbook of Surfactants*: Blackie, Chapman and Hall; New York, 1991), preferably a fluorochemical surfactant. The surfactant may be incorporated in any of the layers of the thermal transfer donor element, preferably in the top layer of the donor element containing the thermal mass transfer material in order to reduce cohesion. Non-limiting examples of fluorochemical surfactants include Fluorad TM surfactants sold by 3M Company.

Suitable donor substrates include plastic sheets and films such as those made of polyethylene terephthalate, fluorene polyester polymer consisting essentially of repeating interpolymerized units derived from 9,9-bis(4-hydroxyphenyl)fluorene and isophthalic acid, terephthalic acid or mixtures thereof, polyethylene, polypropylene, polyvinyl chloride and copolymers thereof, hydrolyzed and unhydrolyzed cellulose acetate. Preferably the donor substrate is transparent.

The thermal transfer donor elements may be prepared by introducing the components for making the propellant and/or thermal mass transfer material layer into suitable solvents (e.g., tetrahydrofuran (THF), methyl ethyl ketone (MEK), toluene, methanol, ethanol, n-propanol, isopropanol, acetone, etc., and mixtures thereof); mixing the resulting solutions at, for example, room temperature; coating the resulting mixture onto the substrate; and drying the resultant coating, preferably at moderately elevated temperatures. Suitable coating techniques include knife coating, roll coating, curtain coating, spin coating, extrusion die coating, gravure coating, etc. The contribution of the propellant layer to the color of the final images is less than 0.2, preferably less than 0.1, absorbance units. Preferably, the propellant layer has a thickness of from about 0.0001 mm to about 0.01 mm, more preferably from about 0.005 mm to about 0.002 mm.

When the thermal mass transfer material is coated as a separate layer on the propellant it may be coated by a variety of techniques including, but not limited to, coating from a solution or dispersion in an organic or aqueous solvent (e.g., bar coating, knife coating, slot coating, slide coating, etc.), vapor coating, sputtering, gravure coating, etc., as dictated by the requirements of the transfer material itself. The thermal transfer material may optionally be highly colored and preferably has a thickness of from about 0.0001 mm to about 0.01 mm, more preferably from about 0.0003 mm to about 0.001 mm.

The thermal transfer donor elements of the present invention are used by placing them in intimate contact (e.g., vacuum hold-down) with a receptor sheet and imagewise heating the thermal transfer donor element. In order to provide rapid heating one or more laser beams are used to provide the enerby necessary for transfer. Single-mode laser diodes and diode-pumped lasers producing 0.1–4 Watt (W) in the near-infrared region of the electromagnetic spectrum may be used as energy sources. Preferably, a solid state infrared laser or laser diode array is employed. Laser exposure dwell times should be from about 0.1 to 5 microseconds and laser fluences should be from about 0.01 to about 1 J/cm$^2$.

The radiation absorber serves to sensitize the thermal transfer donor element to various wavelengths of radiation. The radiation absorber also serves to convert incident electromagnetic radiation into thermal energy. For this reason it is generally desirable that the radiation absorber have low fluorescence and phosphorescence quantum efficiencies and undergo little or no net photochemical change upon exposure to electromagnetic radiation. It is also generally desirable for the radiation absorber to be highly absorptive of the incident radiation so that a minimum amount (weight percent for soluble absorbers or volume percent for insoluble absorbers) can be used in coatings. Non-limiting examples of radiation absorbers include pigments such as carbon black (i.e., acetylene black, channel black, furnace black, gas black, and thermal black), bone black, iron oxide (including black iron oxide), copper/chrome complex black azo pigments (e.g., pyrazolone yellow, dianisidine red, and nickel azo yellow), black aluminum, and phthalocyanine pigments. In addition to pigments, the radiation absorber may be a dye as described, for example, in M. Matsuoka *Absorption Spectra of Dyes for Diode Lasers*: Bunshin Publishing Co.; Tokyo, 1990.

Preferably, the radiation absorber employed in the thermal transfer donor element absorbs in the near-infrared or infrared region of the electromagnetic spectrum. In some instances, it may be desirable to employ absorbers which absorb in the visible region of the electromagnetic spectrum.

Suitable image-receiving (thermal mass transfer-receiving) elements are well known to those skilled in the art. Non-limiting examples of image-receiving elements which can be utilized in the present invention include anodized aluminum and other metals; transparent polyester films (e.g., PET); and a variety of different types of paper (e.g., filled or unfilled, calendered, etc.).

In the practice of the present invention, the thermal transfer donor and receiving elements are brought into contact with one another such that upon application of heat, the thermal mass transfer material is transferred from the donor element to the receiving element. The radiation absorber utilized in the donor element of the present invention acts as a light-to-heat conversion element. A variety of light-emitting sources can be utilized in the present invention including infrared, visible, and ultraviolet lasers. The preferred lasers for use in this invention include high power (>100 mW) single mode laser diodes, fiber-coupled laser diodes, and diode-pumped solid state lasers (e.g., Nd:YAG and Nd:YLF), and the most preferred lasers are diode-pumped solid state lasers. The laser exposure should raise the temperature of the thermal transfer medium above 150° C. and most preferably above 200° C.

After transfer of the thermal mass transfer material from the donor to the receiving elements, an image is created on the receiving element and the donor element may be removed from the receiving element.

The donor material can be provided as sheets or rolls. Either of these can be single colored uniformly within the article, and multiple articles of different colors are used to produce a multi-colored image. Alternately, the donor materials could contain areas of multiple colors, with a single sheet or roll being used to generate multi-colored images.

The following non-limiting examples further illustrate the present invention.

EXAMPLES

Materials used in the following examples were available from standard commercial sources such as Aldrich Chemical Co. (Milwaukee, Wis.) unless otherwise specified. As used herein:

"GAP" is an acronym for a glycidyl azide polymer;

"GAP-diol" refers to a diol-terminated GAP polymer made according to the procedure disclosed in U.S. Pat. Nos. 3,645,917 and 4,268,450 the disclosures which are incorporated herein by reference, and having a molecular weight of about 3,000 and a polydispersity index of less than 2.5.

"GAP-triol" refers to a triol-terminated GAP polymer made according to the procedure disclosed in U.S. Pat. No. 4,962,213, incorporated herein by reference, and having a molecular weight of about 3,500 and a polydispersity index of less than 2.5.

The material constructions described below were evaluated by exposing them with a 200 mW laser beam tuned to 810 nm (unless otherwise indicated). The laser beam was focused with a lens to a 20 μm spot (full width at the $1/e^2$ points) at the media image plane, and was pre-objective scanned across the media at speeds of several thousand cm/s with a galvanometer scanner. The laser beam was typically focused onto the donor sheet and the donor sheet was held in contact with the receiver using a vacuum plate.

Dye A was prepared as disclosed in U.S. Pat. No. 4,547,444 and has the following structure:

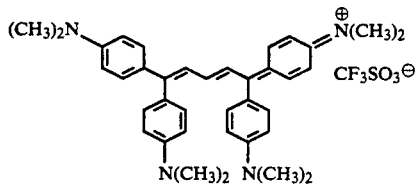

Triazine A was prepared as disclosed in U.S. Pat. No. 3,987,037 and has the following structure:

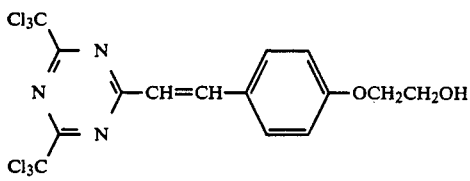

Leuco A was prepared as disclosed in U.S. Pat. No. 3,429,900 and has the following structure:

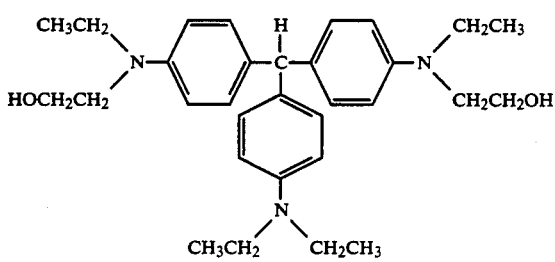

EXAMPLE 1

Mixture A was prepared containing GAP-diol (1.0 g), 0.03 g Dye A (a polymethine NIR dye), 0.03 g Foron Brilliant Blue (a blue dye), and 2.5 g MEK. Mixture B was prepared by combining 0.15 g Desmodur TM D-3200 (a polyisocyanate from Mobay Chemical Co.), 1 drop dibutyltin dilaurate, and 0.5 g MEK. Mixtures A and B were combined just before coating. The combined mixture was coated onto 3 mil polyester terephthalate film with a number 4 Meyer bar (0.36 mil wet, R&D Specialties, Webster, N.Y.) and dried for 4 minutes at 100° C. The material was placed in contact with a clay impregnated paper receptor (CalComp, SSP-A) and vacuum was applied. The laser was scanned across the donor sheet, and the dye/GAP layer was blown away from the direction of laser incidence into the receptor. Complete transfer to paper was achieved with an energy of 0.04 $J/cm^2$ and a pixel dwell time of 500 nanoseconds (sweep rate over 4000 $cm\text{-}sec^{-1}$).

EXAMPLE 2

A coating according to Example 1, but without Foron Brilliant Blue, was overcoated with electrophoretically deposited black toner (3M ScotchCal TM, LT-0104A). The toner was deposited using an extrusion-type, moving head developing station with a reverse bias voltage of 2500 V at a speed of ~1 cm/sec. High resolution transfer to clay impregnated paper (CalComp, SSP-A) was achieved with 0.05 $J/cm^2$ and a 500 nanosecond dwell time.

EXAMPLE 3

A coating according to Example 1, but without Foron Brilliant Blue, was overcoated with a carbon black dispersion. The dispersion was composed of 10 wt % carbon black (Regal 300 TM, Cabot), Rez-o-sperse TM Al (Dover Chemical Company), and Unocal 6017 (Union Oil Company) with a weight ratio of 9:1.8:2 mixed in isopropyl alcohol/deionized water (3:1 weight ratio). The coating was spread with a number 10 Meyer bar (0.9 mil wet thickness) to give a dry layer thickness of ~1.5 μm. The sensitivity was comparable to that in Example 2, and the material completely transferred from the donor sheet to the clay impregnated paper receiver (CalComp, SSP-A), leaving negligible residue behind.

EXAMPLE 4

The donor sheet of Example 2 was used to image toner pigment onto each of three different types of paper receivers. These receivers were European gravure paper (Burda Co., LWC), proofing stock (Mitsubishi Paper Mill Co., Pearl Coat), and notebook paper (Mead brand). Complete laser-addressed transfer of toner was achieved for all three receivers.

EXAMPLE 5

A transferable image was produced on a clear film using the following process: Mixture C was prepared by combining 0.4 g GAP-diol, 0.018 g Dye A, and 1.6 g 1,1,2-dichloroethane. Mixture D was prepared by combining 0.075 g PAPI 27 TM (diphenylmethane diisocyanate from Dow Chemical Co.), 1 drop dibutyltin dilaurate, and 0.2 g methyl ethyl ketone. Mixtures C and D were combined just before coating onto 3 mil polyester film with a number 4 Meyer bar (0.36 mil wet thickness). The coating was dried for 4 min at 110° C. This coating was overcoated with a cyan toner dispersion (VPC-3, Lot no. 001 at 12% solids from Hilord Chemical Corp.) using a number 6 Meyer bar (0.54 mil wet thickness). This coating was dried for 2 minutes at 110° C.

The polyester donor sheet was placed in intimate contact with clay impregnated paper (CalComp, SSP-A) and exposed with the laser. Complete transfer to the receiver was achieved.

EXAMPLE 6

A comparison was made between GAP-diol and inert binder as a propellant layer. PET donor sheet A was coated with two layers: (1) an underlying layer of 7% Dye A in 1,1,2-trichloroethane coated with a number 20 Meyer bar (1.8 mil wet thickness), and (2) an upper layer of 3M Scotchprint TM magenta toner coated with a number 6 Meyer bar (0.54 mil wet thickness). Each layer was individually dried at 100° C. for 2 min. PET donor sheet B was coated with two layers: (1) a lower layer of GAP-diol polymer coated according to Example 1, but without Foron Brilliant Blue, coated with a number 20 Meyer bar (1.8 mil wet thickness), and (2) an upper layer of magenta Scotchprint TM toner coated with a number 6 Meyer bar (0.54 mil wet thickness). Both donor sheets were placed in intimate contact with a clay-impregnated paper receiver sheet and held together with a vacuum. Sample B exhibited complete laser addressed transfer from the donor to the receptor, whereas Sample A did not.

EXAMPLE 7

A comparison similar to that of Example 6 was made between GAP-diol and a propellant layer containing 4-azidosulfonylbenzoic acid. A coating solution was prepared by combining 4.0 g (10 wt % solution) of Butvar B-76 TM (Monsanto) in MEK, 0.03 g Dye A, and 0.08 g 4-azidosulfonylbenzoic acid. This solution was coated onto 3 mil polyester film using a number 10 Meyer bar (0.9 mil wet thickness) and dried for 2 min at about 90° C. This coating was topcoated with magenta 3M Scotchprint TM toner with a number 4 Meyer bar (0.36 mil wet thickness) and dried for 2 min at about 90° C. The GAP-diol sample of Example 6 was topcoated as above. Complete laser addressed transfer of material was achieved with the GAP-based sample, whereas only partial transfer was achieved with the 4-azidosulfonylbenzoic acid sample.

EXAMPLE 8

Solution E was prepared by combining 5.0 g 20 wt % GAP triol (L-11999 from 3M Company) in 1,1,2-dichloroethane and 0.03 g Dye A. Solution F was prepared by combining 0.15 g Desmodur 3200 TM, 0.5 g MEK, 2 drops dibutyltin dilaurate, and 0.5 g of a 0.4 wt % tris(acetylacetonato)iron in MEK.

Solutions E and F were mixed together and coated onto 3 mil plain polyester film with a number 6 Meyer bar (0.54 mil wet thickness). The coating was dried at 90° C. for 4 min.

Cyan pigment (copper phthalocyanine) was vapor coated onto this GAP-triol propellant layer. The propellant-coated polyester sheet was held within 1.4 inches of the heated source (~400° C.) of cyan pigment in a vacuum chamber that was evacuated to $1 \times 10^{-5}$ Torr. The sheet was moved past the source at a rate of 0.01 meters/sec.

Complete laser addressed transfer of pigment from the donor to the clay-impregnated paper (CalComp, SSP-A) receptor was achieved.

EXAMPLE 9

A laser imaged lithographic printing plate was produced on aluminum. A crosslinkable resin was coated on top of a GAP-triol propellant layer prepared according to Example 8. A topcoat solution was prepared consisting of a solution containing 2 g of a 23 wt % m-cresol Novolac TM resin (Borden Chemical) in MEK, 0.12 g Resimene 747 TM (Monsanto), and 0.005 g p-toluenesulfonic acid.

The topcoat solution was applied with a number 6 Meyer bar (0.54 mil wet thickness), and was dried for 2 min at about 80° C. After laser-addressed transfer of the resin to a silicated aluminum plate (3M Company, ABF type), the resin was crosslinked in a heated oven for 1 min at 120° C. When the plate was inked (U-620 Rub Up Ink TM, Printing Developments, Inc.) in a water/ink solution, only the imaged lines accepted ink.

EXAMPLE 10

This following example describes a colored aqueous pigment dispersion coating on a GAP propellant layer.
Solutions A and B were prepared as described below.
Solution A: 100 mg dye A in 9.9 g MEK.
Solution B: 5 g 20 wt % GAP triol in MEK, 1 g Desmodur 3200 TM, 1 drop dibutyltin dilaurate, 3.3 g MEK.

Solution A (3.0 g) was added to 3.0 g of solution B. The solution was coated onto 3 mil polyester with a number 20 Meyer bar (1.8 mil, wet) and cured for 5 min at 90° C.

The following solutions were prepared: Microlith Red RBS-WA TM (Ciba-Geigy Corp.) was laid down according to the directions from the manufacturer to give a dispersion. Water (30 g) was added to 12 g isopropanol and mixed in a high shear mixer at low speed. Resin/pigment (18 g) were mixed in and 4 g of concentrated ammonia solution was added. The speed of the mixer was raised to med/high, and mixed for 10 min until a drop of the solution on polyester film showed no particles under high magnification. 10 g of water and 4 g isopropanol were added and mixed at low speed for 5 min. A solution of FC-170C TM fluorocarbon surfactant (3M Company) was prepared in a 10% isopropanol solution and then diluted with an equal volume of water. Vancryl 600 TM resin (a 50% aqueous dispersion of an ethylene-vinyl chloride copolymer, Air Products and Chemicals, Inc.) was also obtained. These 3 solutions were combined as follows: 1.5 g Ciba-Geigy RBS red solution, 1 g 5% FC-170C TM solution, 0.5 g Vancryl 600 TM solution, and 3 g water.

The coating was applied to the GAP layer with a number 7 Meyer bar (0.63 mil wet), and cured at 90° C. for 5 min. Complete laser-addressed transfer to clay-impregnated paper (CalComp, SSP-A) was achieved.

EXAMPLE 11

The donor sheet described in Example 10 above was placed in vacuum contact with a 3M 2500 Transparency TM sheet. Complete laser-addressed transfer of the donor pigment to the transparency was achieved.

EXAMPLE 12

Nitrocellulose was compared to GAP as a propellant in the underlayer. Four donor sheets were prepared as follows:

| | |
|---|---|
| Solution A: | 1.3 g RS nitrocellulose (Hercules)/0.7 g toluene in 18 g MEK |
| Solution B: | 100 mg dye A in 9.9 g MEK |
| Solution C: | 20% GAP-triol in MEK     5 g<br>Desmodur 3200 TM     1 g<br>dibutyltin dilaurate     1 drop<br>MEK     12.8 g |
| Solution D: | 1 g solution A added to 0.4 g Solution B |
| Solution E: | 0.75 g solution A added to 0.25 g solution C and 0.4 g solution B |
| Solution G: | 0.25 g solution A added to 0.75 g solution C and 0.4 g solution B |
| Solution H: | 1 g solution C added to 0.4 g solution B |
| Solution L: | 1.5 g pigment dispersion from Ciga-Geigy (as in Example 10)<br>1.0 g (5 wt % solution of FC 170C TM in 50/50 water/isopropanol)<br>0.5 g Airflex 4530 TM (Air Products and Chemicals, Inc.) |

Solutions D–H were each individually coated on 2 mil PET with a number 4 Meyer bar (0.36 mil wet) and cured at 90° C. for 5 min.

Solution L was coated on top of each sample D–H with a number 6 Meyer bar (0.54 mil wet), and dried for 5 min at 90° C.

Laser addressed transfer did not occur for donor sheets using solutions D and E as the propellant layer. Partial transfer was obtained with solution G. Complete transfer was obtained with solution H.

EXAMPLE 13

A GAP propellant layer was prepared as described in Example 8. This coating was overcoated with a photopolymerizable composition which consisted of:

| | |
|---|---|
| SR-295 TM (pentaerythritol tetraacrylate, Sartomer) (50 wt % in MEK) | 1.1 g |
| Polymer A (34.4% wt in MEK)* | 1.6 g |
| triazine A | 60.0 mg |
| leuco-A | 36.0 mg |
| azeotrope (78% n-propanol, 22% H$_2$O) | 7.2 g |

*Polymer A, a reactive polymer (95 to 5 mol % monomer ratio random copolymer of vinyldimethylazlactone (VDM) and dimethylaminoethyl methacrylate wherein the VDM monomer units have been ring opened after copolymerization by reaction with hydroxyethyl methacrylate, aspartic acid monotetrabutylammonium salt, and water in a molar ratio of 70:10:20 in the presence of 1,8-diazabicyclo[5.4.0]undec-7-ene as a 34.4% solution in MEK.

The photopolymer layer was coated with a number 13 Meyer bar (1.1 mil, wet) under yellow light and dried by blowing a hot air gun over it for a few seconds.

The donor sheet was placed in contact with a 3M ABF TM metal base receptor. The receptor was wrapped around a drum and scanned with a wide stripe laser diode. The laser power was 600 mW and the focused spot size was 45×160 μm (full width at 13.5% peak). The drum was scanned at 50 cm/sec, producing helically-scanned lines on the medium. After the laser exposure, the plate was exposed to a 2 kW Berkey Ascor UV lamp for 20 seconds, thus crosslinking the polymer. The polymer was inked in the presence of water, demonstrating a dry-processed lithographic printing plate.

EXAMPLE 14

Cyan pigment was added to GAP and coated onto polyester film. The cyan pigment dispersion was composed of Formvar TM (Monsanto) resin, phthalocyanine blue pigment, and 1,1,2-trichloroethane at 2.4% solids. The solution was prepared as disclosed in U.S. Pat. No. 3,671,236 at column 3, line 65. 5 g of this pigment dispersion was added to 2 g of solution H described in Example 12. This pigmented GAP solution was coated onto 3 mil polyester film with a number 20 Meyer bar (1.8 mil, wet), and the coating was cured for 5 min at 90° C. Complete laser transfer of this single layer coating to clay-impregnated paper was achieved.

EXAMPLE 15

Donor sheets suitable for imaging with a Nd:YAG laser were prepared. Cyasorb 165 TM IR dye (American Cyanamid) was used in place of dye no. 1 (see Table 1) in the preparation of the GAP coating of Example 10. Red, yellow, and blue pigment dispersions were each coated onto separate GAP-coated donor sheets. These pigment dispersions were Microlith red RBS-WA TM, yellow 2R-WA TM, and blue 4G-WA TM (all from Ciba-Giegy).

These donor sheets were exposed with a 30 W Nd:YAG laser beam that was focused to a 120 μspot. The pixel dwell time was 66 msec. Complete laser addressed transfer was achieved to several receptors. These receptors included clay impregnated paper (Cal-Comp, SSP-A), plastic coated cardboard, and the sides of 3M Post-It TM Repositionable Note cubes. Yellow and cyan as well as yellow and magenta were imaged on top of one another on the clay impregnated paper to demonstrate overprinting.

EXAMPLE 16

Preparation of Thermal Transfer Donor-Containing GAP and Photopolymer

A GAP-triol primed polyethylene terephthalate was prepared as in Example 8. Thus, Solution E was prepared by combining 5.0 g 20 wt % GAP triol (L-11999) in 1,1,2-dichloroethane and 0.03 g Dye A. Solution F was prepared by combining 0.15 g Desmodur 3200 TM, 0.5 g MEK, 2 drops dibutyltin dilaurate, and 0.5 g of a 0.4 wt % tris(acetylacetonato)iron in MEK.

Solutions E and F were mixed together, and coated onto 3 mil plain polyester film with a number 6 Meyer bar (0.54 mil wet thickness). The coating was dried at 90° C. for 4 min.

The resultant propellant layer was overcoated with the following printing plate solution using a number 12 Meyer bar and dried in air at room temperature:

| Parts by weight | Chemical Constituent |
|---|---|
| 60.4 | ketone soluble sulfonated polyester diazo |
| 17.0 | ketone soluble sulfopolyester |
| 6.0 | Cellulose acetate butyrate (CAB 500-5 TM) |
| 0.6 | 4-phenylazodiphenylamine |
| 16.0 | Vinyl/pigment mill base 5:1 Phthalocyanine blue/VYNS-3 (vinyl chloride/acetate copolymer from Union Carbide, Danbury, CT) |
| 898 | methyl ethyl ketone (MEK) |
| 2 | water |

EXAMPLE 17

Digital Printing Plate-making

The donor sheet from Example 17 was laid onto the silicated PET plate receptor from Example 16 and the composite was held to a vacuum platen. An 810 nm IR laser, 600 mW with a 50×150 μm spot size (full width at 13.5% peak) was scanned at 20 cm/sec, and photopolymer was transferred imagewise to the PET plate. As a result, a clear sharp mass transferred image was formed on the PET plate. The adhesion of the resultant image to the plate appeared to be good. It was then exposed to UV in a Berkey Ascor unit for 30 seconds. The resulting image was tough and could not be removed by a PSA tape such as Scotch tape.

EXAMPLE 18

Inkability of the Plate

The resulting plate of Example 18 was evaluated for inkability. The results showed that only the image area having the polymer adsorbed ink. The background was essentially free of ink.

Reasonable modifications and variations are possible from the foregoing disclosure without departing from either the spirit or scope of the present invention as defined by the claims.

We claim:

1. A thermal transfer donor element comprising a substrate having coated on at least a portion thereof a layer comprising: (a) a gas-producing polymer having a thermally available nitrogen content of greater than about 10 weight percent; (b) a radiation absorber; and (c) a thermal mass transfer material.

2. The thermal transfer donor element according to claim 1 wherein said gas-producing polymer has a thermally available nitrogen content of greater than about 20 weight percent.

3. The thermal transfer donor element according to claim 1 wherein said gas-producing polymer has a thermally available nitrogen content of greater than about 30 weight percent.

4. The thermal transfer donor element according to claim 1 where in said gas-producing polymer has the following formula:

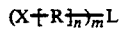

X represents a hydroxyl, mercapto, or amino group;
R represents a divalent monomer group, containing a thermally-decomposable nitrogen-containing group, derived from an oxirane, a thiirane, or aziridine;
L represents a mono-, di-, tri- or tetra-valent alkyl radical, and correspondingly,
m represents 1, 2, 3, or 4; and
n represents any integer greater than 1.

5. The thermal transfer donor element according to claim 4 wherein said gas-producing polymer is reacted with a crosslinking agent.

6. The thermal transfer donor element according to claim 1 wherein said gas-producing polymer is a poly[bis(azidomethyl)oxetane] having recurring units of the following formula:

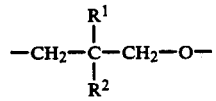

wherein $R^1$ and $R^2$ each independently represent a thermally decomposable nitrogen-containing group.

7. The thermal transfer donor element according to claim 1 wherein said gas-producing polymer is a block or random copolymer comprising units derived from at least two different monomers, at least one of said monomers containing an energetic nitrogen-containing group.

8. The thermal transfer donor element according to claim 1 wherein said radiation absorber is one which absorbs near infrared or infrared radiation.

9. The thermal transfer donor element according to claim 1 wherein said radiation absorber is one which absorbs visible light.

10. A thermal transfer donor element comprising a substrate having coated on at least a portion thereof a first layer comprising: (a) a gas-producing polymer having a thermally available nitrogen content of greater than about 10 weight percent; and (b) a radiation absorber; and a second layer comprising a thermal mass transfer material coated onto said first layer.

11. The thermal transfer donor element according to claim 10 wherein said gas-producing polymer has a thermally available nitrogen content of greater than about 20 weight percent.

12. The thermal transfer donor element according to claim 10 wherein said gas-producing polymer has a thermally available nitrogen content of greater than about 30 weight percent.

13. The thermal transfer donor element according to claim 10 wherein said gas-producing polymer has the following formula:

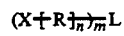

X represents a hydroxyl, mercapto, or amino group;
R represents a divalent monomer group, containing a thermally decomposable nitrogen-containing group, derived from an oxirane, a thiirane, or aziridine;
L represents a mono-, di-, tri- or tetra-valent alkyl radical and correspondingly, m represents 1, 2, 3, or 4; and
n represents any integer greater than 1.

14. The thermal transfer donor element according to claim 13 wherein said gas-producing polymer is reacted with a crosslinking agent.

15. The thermal transfer donor element according to claim 10 wherein aid gas-producing polymer is a poly[bis(azidomethyl)oxetane] having recurring units of the following formula:

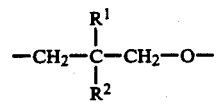

wherein $R^1$ and $R^2$ each independently represent a thermally decomposable nitrogen-containing group.

16. The thermal transfer donor element according to claim 10 wherein said gas-producing polymer is a block or random copolymer comprising units derived from at least two different monomers, at least one of said monomers containing an energetic nitrogen-containing group.

17. The thermal transfer donor element according to claim 10 wherein said radiation absorber is one which absorbs near infrared or infrared radiation.

18. The thermal transfer donor element according to claim 10 wherein said radiation absorber is one which absorbs visible light.

19. A thermal transfer donor element comprising a substrate having coated sequentially thereon: (a) a first layer comprising a radiation absorber; (b) a second layer comprising a gas-producing polymer having a thermally available nitrogen content of greater than about 10 weight percent; and (c) a third layer comprising a thermal mass transfer material.

20. The thermal transfer donor element according to claim 19 wherein said radiation absorber is one which absorbs near infrared or infrared radiation.

21. The thermal transfer donor element according to claim 20 wherein said radiation absorber is one which absorbs visible light.

22. The thermal transfer donor element according to claim 19 wherein said gas-producing polymer has a thermally available nitrogen content of greater than about 20 weight percent.

23. The thermal transfer donor element according to claim 19 wherein said gas-producing polymer has a thermally available nitrogen content of greater than about 30 weight percent.

24. The thermal transfer donor element according to claim 19 wherein said gas-producing polymer has the following formula:

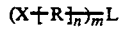

X represents a hydroxyl, mercapto, or amino group;
R represents a divalent monomer group, containing a thermally decomposable nitrogen-containing group, derived from an oxirane, a thiirane, or aziridine;
L represents a mono-, di-, tri- or tetra-valent alkyl radical and correspondingly, m represents 1, 2, 3, or 4; and
n represents any integer greater than 1.

25. The thermal transfer donor element according to claim 24 wherein said gas-producing polymer is reacted with a crosslinking agent.

26. The thermal transfer donor element according to claim 19 wherein aid gas-producing polymer is a poly[bis(azidomethyl)oxetane] having recurring units of the following formula:

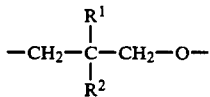

wherein $R^1$ and $R^2$ each independently represent a thermally decomposable nitrogen-containing group.

27. The thermal transfer donor element according to claim 19 wherein said gas-producing polymer is a block or random copolymer comprising units derived from at least two different monomers, at least one of said monomers containing an energetic nitrogen-containing group.

28. A thermal transfer donor element comprising a substrate having successively coated thereon: (a) a first layer comprising a gas-producing polymer having a thermally available nitrogen content of greater than about 10 weight percent; (b) a second layer comprising a radiation absorber; and (c) a third layer comprising a thermal mass transfer material.

29. The thermal transfer donor element according to claim 28 wherein said gas-producing polymer has a thermally available nitrogen content of greater than about 20 weight percent.

30. The thermal transfer donor element according to claim 28 wherein said gas-producing polymer has a thermally available nitrogen content of greater than about 30 weight percent.

31. The thermal transfer donor element according to claim 28 wherein said gas-producing polymer has the following formula:

X represents a hydroxyl, mercapto, or amino group;
R represents a divalent monomer group, containing a thermally decomposable nitrogen-containing group, derived from an oxirane, a thiirane, or aziridine;
L represents a mono-, di-, tri- or tetra-valent alkyl radical and correspondingly, m represents 1, 2, 3, or 4; and
n represents any integer greater than 1.

32. The thermal transfer donor element according to claim 31 wherein said gas-producing polymer is reacted with a crosslinking agent.

33. The thermal transfer donor element according to claim 28 wherein aid gas-producing polymer is a poly[bis(azidomethyl)oxetane] having recurring units of the following formula:

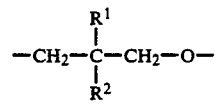

wherein $R^1$ and $R^2$ each independently represent a thermally decomposable nitrogen-containing group.

34. The thermal transfer donor element according to claim 28 wherein said gas-producing polymer is a block or random copolymer comprising units derived from at least two different monomers, at least one of said monomers containing an energetic nitrogen-containing group.

35. The thermal transfer donor element according to claim 28 wherein said radiation absorber is one which absorbs near infrared or infrared radiation.

36. The thermal transfer donor element according to claim 28 wherein said radiation absorber is one which absorbs visible light.

37. A process for forming an image comprising the steps of:
(a) bringing the thermal transfer donor element of claim 1 into contact with an image-receiving element; and
(b) imagewise exposing the construction of (a), thereby transferring the thermal mass transfer material of said thermal transfer donor element to said receiving element.

38. The process according to claim 37 wherein the imagewise exposure in step (b) utilizes an infrared, ultraviolet, or visible laser.

39. The process according to claim 38 wherein said laser is an infrared laser.

* * * * *